(12) United States Patent
Chen et al.

(10) Patent No.: US 7,844,408 B2
(45) Date of Patent: Nov. 30, 2010

(54) SYSTEM AND METHOD FOR TIME DOMAIN REFLECTOMETRY TESTING

(75) Inventors: Ming-Kia Chen, Taipei (TW); Bor-Ray Su, Taipei (TW)

(73) Assignee: NVIDIA Corporation, Santa Clara, CA (US)

( * ) Notice: Subject to any disclaimer, the term of this patent is extended or adjusted under 35 U.S.C. 154(b) by 260 days.

(21) Appl. No.: 11/875,783

(22) Filed: Oct. 19, 2007

(65) Prior Publication Data

US 2009/0105971 A1    Apr. 23, 2009

(51) Int. Cl.
*G01R 31/00* (2006.01)
*G01R 31/14* (2006.01)

(52) U.S. Cl. ......................................... 702/58; 702/117

(58) Field of Classification Search .................... 702/57, 702/58, 65, 117, 119, 123, 76, 85, 107; 324/500, 324/533, 534, 537, 763, 765, 76.19, 601, 324/605; 714/712, 724
See application file for complete search history.

(56) References Cited

U.S. PATENT DOCUMENTS

| | | | | |
|---|---|---|---|---|
| 6,920,407 | B2 * | 7/2005 | Adamian et al. | 702/104 |
| 7,271,575 | B2 * | 9/2007 | Pickerd et al. | 324/76.19 |
| 2004/0027138 | A1 * | 2/2004 | Pickerd et al. | 324/646 |
| 2005/0177328 | A1 * | 8/2005 | Belforte et al. | 702/65 |

* cited by examiner

*Primary Examiner*—Michael P Nghiem
(74) *Attorney, Agent, or Firm*—Patterson & Sheridan, LLP

(57) ABSTRACT

A time domain reflectometry ("TDR") testing method that includes storing test data resulted from a TDR test applied on an electronic component, displaying the test data, identifying a distinctive portion of the test data corresponding to a defective location in the electronic component, modifying the distinctive portion of the test data, and computing the modified test data to verify whether a predetermined requirement is satisfied.

16 Claims, 7 Drawing Sheets

SYSTEM AND METHOD FOR TIME DOMAIN REFLECTOMETRY TESTING

BACKGROUND OF THE INVENTION

1. Field of the Invention

The present invention generally relates to testing of electronic devices, and more particularly a system and method for time domain reflectometry testing.

2. Description of the Related Art

Unless otherwise indicated herein, the approaches described in this section are not prior art to the claims in this application and are not admitted to be prior art by inclusion in this section.

Computer electronic components usually have to undergo a number of testing steps to ensure that they perform correctly. The time domain reflectometry ("TDR") technique is one well-known testing method that is applied to characterize and locate faults in a conductive path of an electronic device. In this technique, a time domain reflectometer applies an input signal that is transmitted along a conductor in a device under test, and then detects a resulting reflection signal returned from the tested device. The reflection signal is a signal in function of time that is indicative of any discontinuities in the conductor impedance. To evaluate whether the device passes a requisite compliance test in the frequency domain, the detected signal is converted into frequency spectrum data, also called the return loss data, which are then compared against a predetermined level.

To illustrate, FIG. 1A is a simplified diagram of a conventional TDR testing setup 100. The testing setup 100 includes a TDR testing machine 110 that is coupled to a device under test 102 mounted on a printed circuit board ("PCB") 104. The tested device 102 may include any computer electronic devices, such as a central processing unit, a graphics processing unit, chipset units, and the like. The testing machine 110 may be coupled to the tested device 102 via a suitable connector interface 106 provided for the tested device 102.

During testing, an end terminal 112 of the testing machine 110 applies an electric pulse signal that is transmitted to the tested device 102. Any impedance discontinuities along the transmission path of the inputted electric pulse signal will create echoes in a reflection signal returned by the tested device 102 and detected at the end terminal 112 of the testing machine 110. FIG. 1B is a schematic graph illustrating a graphic representation 120 of a reflection signal that may be measured at the end terminal 112. To determine whether the tested device 102 meets a standard requirement, the returned reflection signal is converted into return loss data, which are then compared against a predetermined threshold reference. FIG. 1C is a schematic graph illustrating corresponding return loss data 122 that are computed and compared against a threshold reference 124. If the return loss data 122 are entirely below the threshold reference 124, the tested device 102 complies with the standard requirement. Otherwise, the test has failed, and correction in the physical structure of the tested device 102 is needed.

While the aforementioned testing flow allows to generally determine the presence of defective conductor portions, it however fails to provide information helpful to the correction operation of the failed device 102. Even though the positions of certain distinctive peaks in the reflection signal 120 may be used to identify the defective portions that need reworking, another TDR test is still needed after the rework operation to ensure that all defects have been addressed. As a result, it is possible that multiple TDR testing and correction operations are needed before the tested device 102 successfully passes the compliance test, which increase the verification time and the labor cost as each correction requires a physical modification of the device 102.

Therefore, what is needed is an TDR testing system and method capable of providing information that will help in the correction operation of failed devices, and address at least the problems set forth above.

SUMMARY OF THE INVENTION

In one embodiment, the present application describes a TDR testing method. The method comprises storing test data resulted from a TDR test applied on an electronic component, displaying the test data, identifying a distinctive portion of the test data corresponding to a defective location in the electronic component, modifying the distinctive portion of the test data, and computing the modified test data to verify whether a predetermined requirement is satisfied.

In another embodiment, a TDR testing computer system is disclosed. The system comprises a memory for storing test data resulted from a TDR test applied on an electronic component, a display device, an input device, and a processing unit configured to selectively modify a distinctive portion of the test data identified as corresponding to a defective location in the electronic component, and compute the modified test data to verify whether a predetermined requirement is satisfied.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

One embodiment of the invention may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored.

Figure 1A:
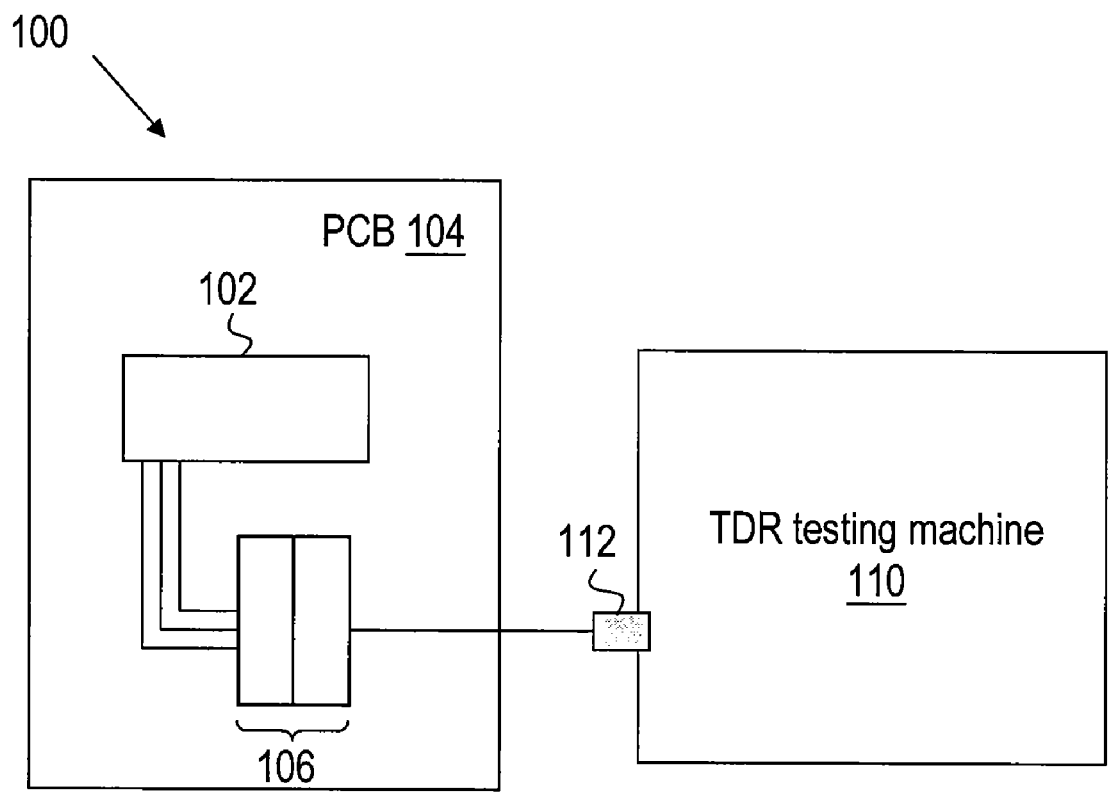
FIG. 1A is a simplified diagram of a conventional TDR testing setup.
Figure 1B:
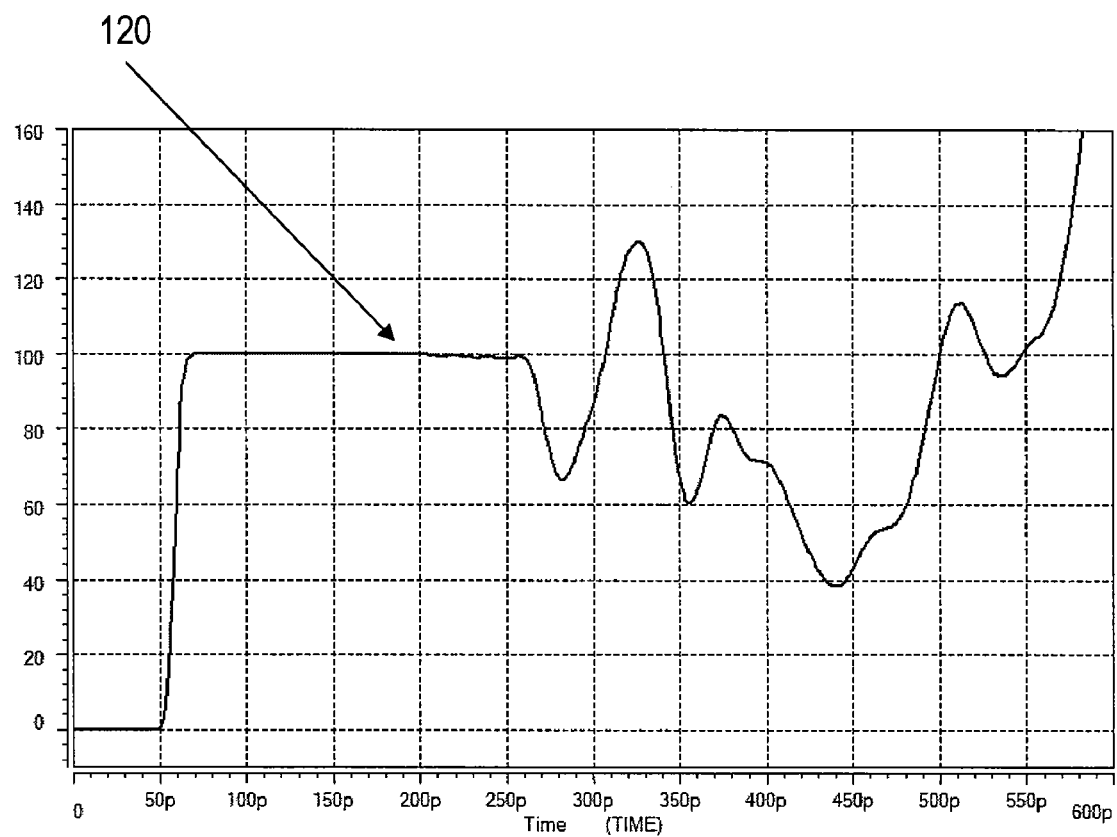
FIG. 1B is a schematic graph illustrating typical test data of a reflection signal detected in a TDR testing machine.
Figure 1C:
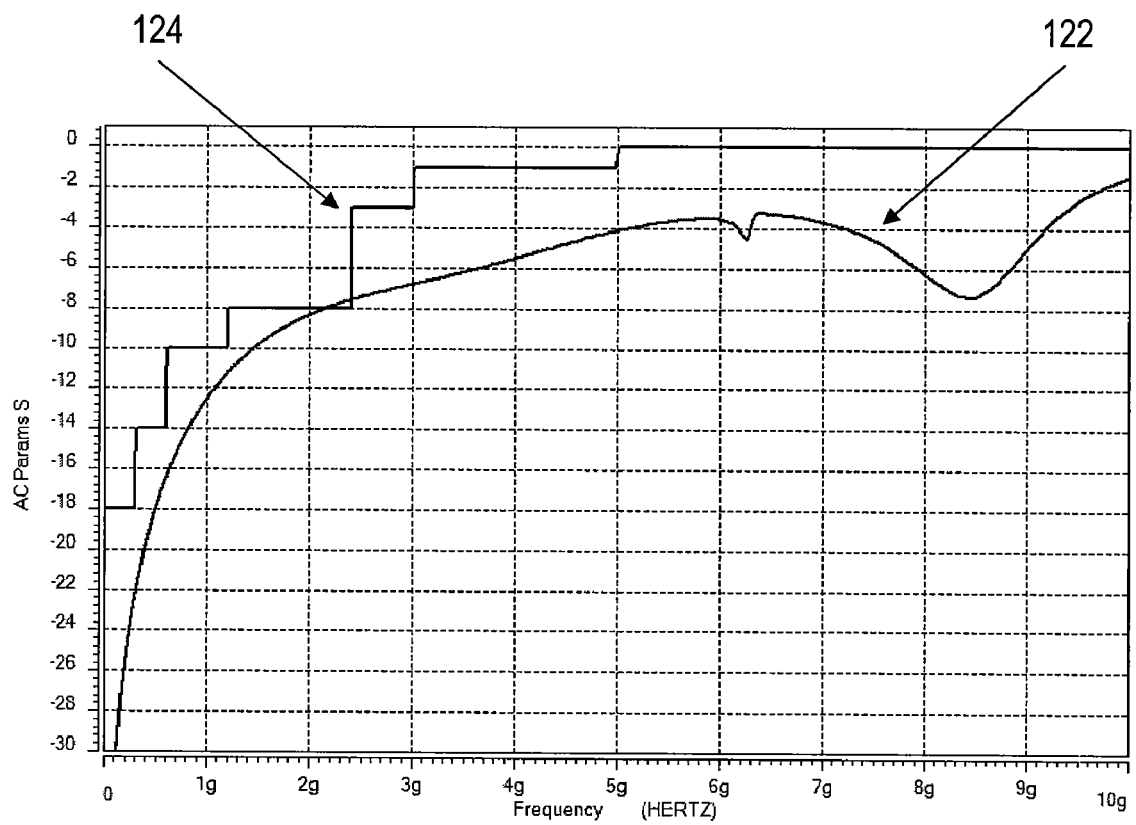
FIG. 1C is a schematic graph illustrating how test data are conventionally computed and evaluated to meet a standard requirement.
Figure 2A:
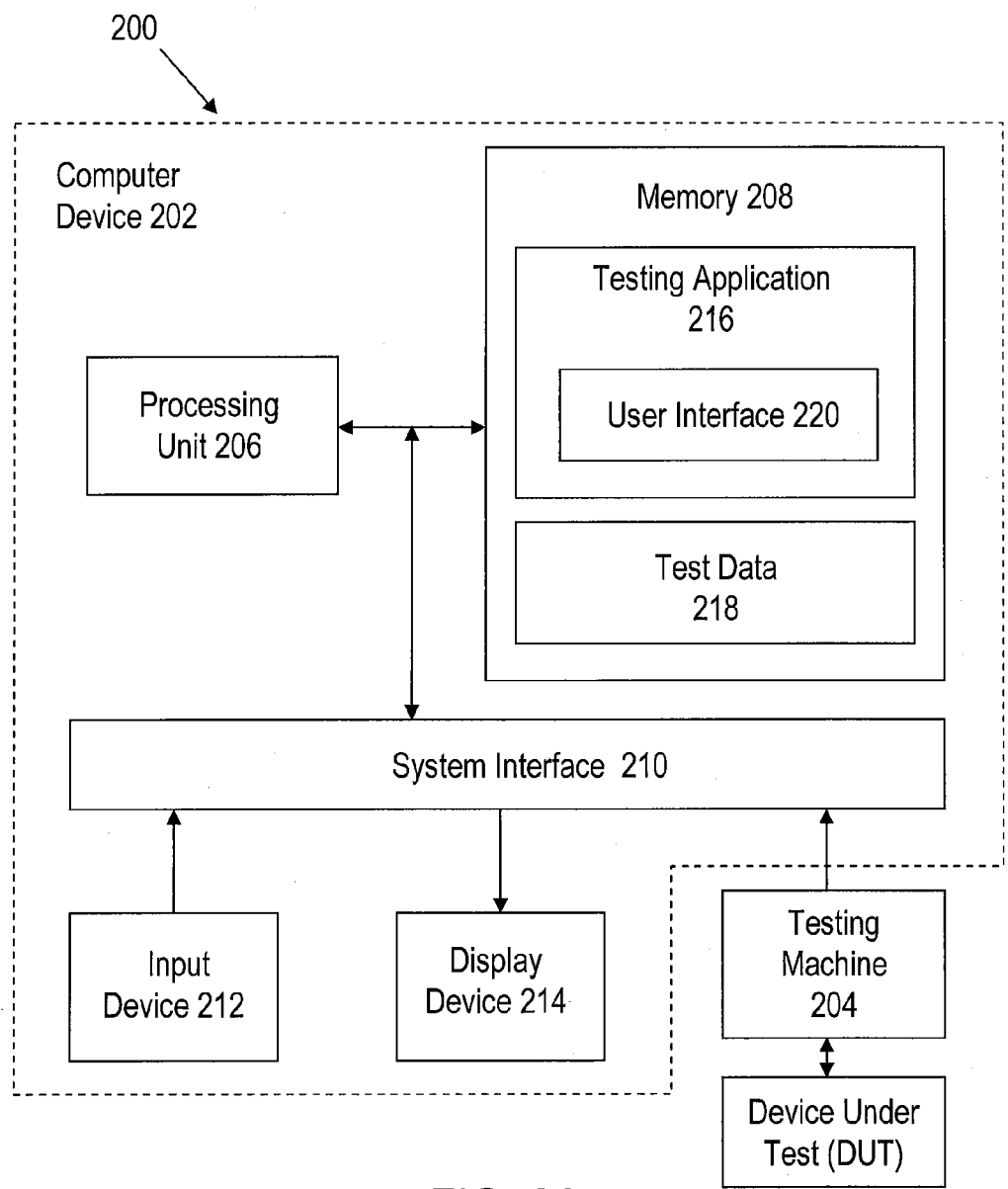
FIG. 2A is a schematic diagram of a testing system implementing one or more aspects of the present invention.

FIG. 2A is a schematic diagram of a testing system 200 implementing one or more aspects of the present invention. The testing system 200 includes a computer device 202 that may be coupled to a testing machine 204. The computer device 202 includes a processing unit 206 that is coupled to a memory 208, a system interface 210, an input device 212, and a display device 214. The memory 208 typically includes dynamic random access memory (DRAM) configured to connect to the processing unit 206. The processing unit 206 is adapted to execute programming codes of a testing application 216 stored in the memory 208, operates on TDR test data 218 stored in the memory 208, and may communicate with the input device 212, the display device 214 and the testing machine 204 through the system interface 210.

The system interface 210 may include a system bus, a memory controller, universal serial bus, and other interfaces necessary to establish communication links between the processing unit 206 and the input device 212, display device 214 and testing machine 204. The input device 212 may include a keyboard, a pointer mouse, and any devices enabling user's inputs during the execution of the testing application 216. The display device 214 is an output device capable of emitting a visual image corresponding to an input data signal. For example, the display device may be built using a cathode ray tube (CRT) monitor, a liquid crystal display, or any other suitable display system.

The testing machine 204 is operable to perform TDR testing on an electronic device (DUT). The test results obtained by the testing machine 204, which include sampled values of the time reflection signal, may be directly transferred through the system interface 210 to be stored as test data 218 into the memory 208. In alternate embodiments, the test data 218 provided by the testing machine 204 may be initially stored in a remote storage device (not shown), and then loaded into the memory 208 for execution of the testing application 216.

The processing unit 206 executes the testing application 216 to display the test data 218 in a visual form on the display device 214, such that the user is able to modify and change portions of the test data 218 thanks to a user interface 220 incorporated in the testing application 216. The user interface 220 may include a graphic user interface. As a result, the user is able to desirably simulate at least a portion of the test data 218 corresponding to the reflection signal. Furthermore, the testing application 216 is configured to cause the processing unit 206 to operate on the test data 218 to derive return loss data, and then evaluate whether the return loss data satisfy a standard requirement in a compliance test.

Figure 2B:
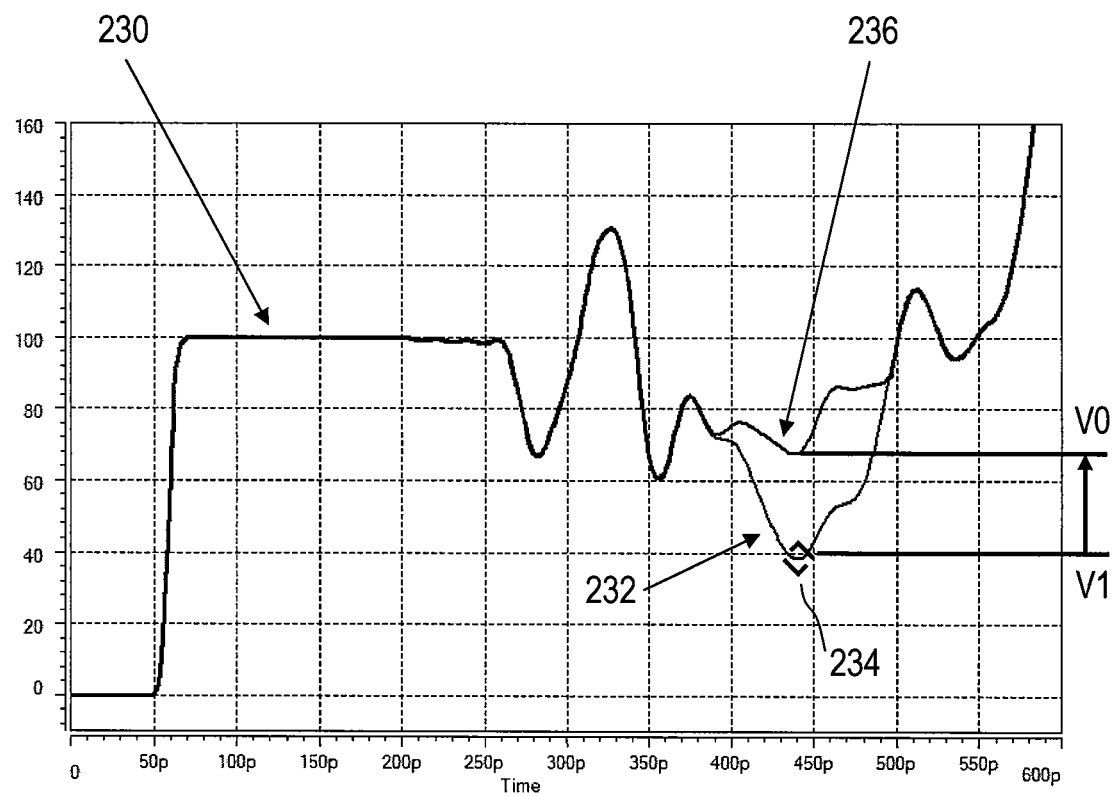
FIG. 2B is a schematic graph illustrating an example of how TDR test data may be modified according to an embodiment of the present invention.
Figure 2C:
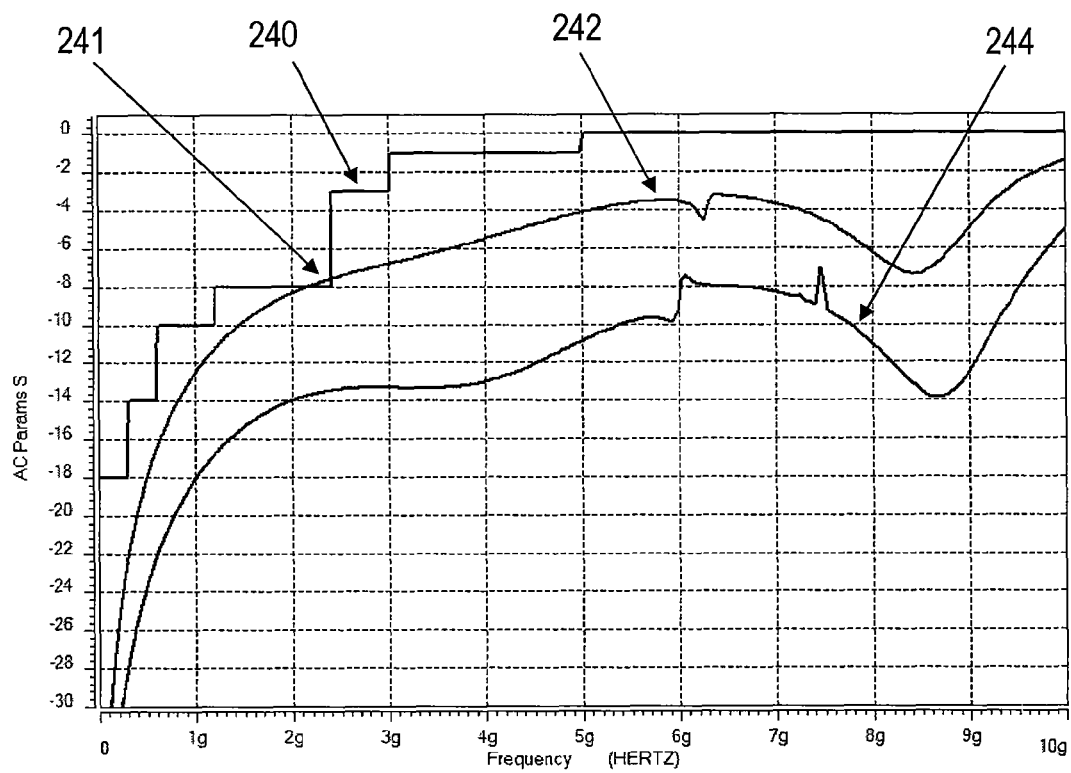
FIG. 2C is a schematic graph illustrating examples of return loss data respectively derived from original and modified test data according to an embodiment of the present invention.
Figure 3:
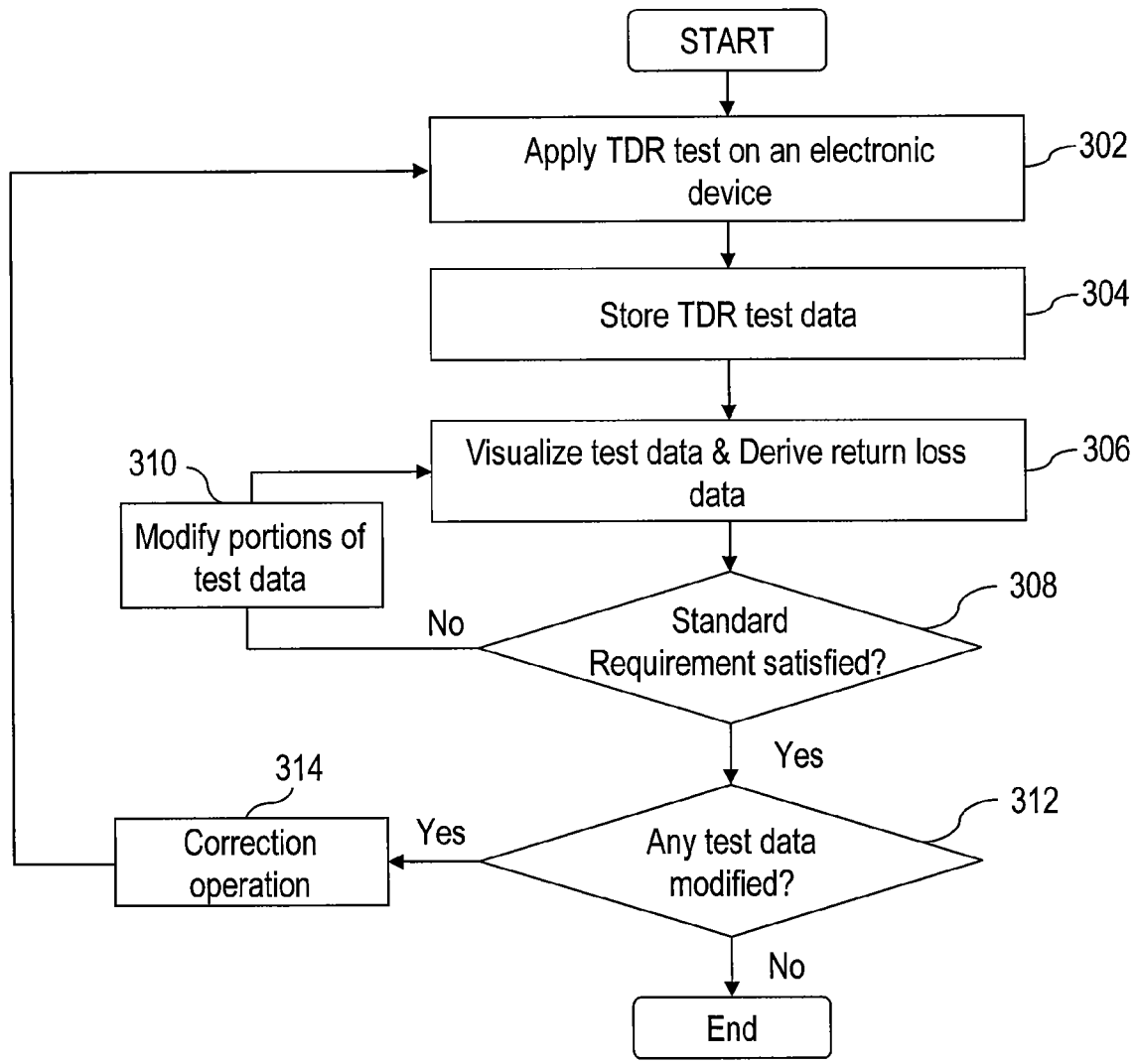
FIG. 3 is a flowchart of method steps performed in a TDR testing process according to one embodiment of the present invention.

In conjunction with FIG. 2A, FIG. 2B and FIG. 2C are schematic graphs illustrating how the test data 218 may be modified according to an embodiment of the present invention. Referring to FIG. 2B, the test data 218 may be visualized on the display device 214 in the form of a graphic representation 230 that plots the reflection signal in function of time. As shown in FIG. 2C, to verify whether the standard requirement is met, return loss data 242 in function of frequency are derived from the test data 218 and then compared against a predetermined threshold reference 240. When a portion 241 of the return loss data 242 exceeds the threshold reference 240, the compliance test has failed, indicating the presence of defects. Defective locations in the tested device may be identified based on the position of certain distinctive portions of the graphic representation 230 including, without limitation, a peak, a dip, a resonance, or a level shift from the required value. For the purpose of illustration, suppose that one identified defective location corresponds to a dip region 232. By using the input device 212, the user is able to manually modify a value V1 of the dip region 232 to another value V0 that simulates an expected test result which may be obtained after the application of a virtual correction operation on the identified defective location. In an example of implementation, the manual modification of the test data 218 may be made by selecting the value V1 in the dip region 232 with a selector icon 234, and then entering or displacing the selector icon 234 to the desired value V0. In this manner, the dip region 232 of the test data 218 may be changed to a simulated test result portion 236. Based on the modified test data 218, simulated return loss data 244 are computed and evaluated again against the threshold reference 240, as shown in FIG. 2C. The standard requirement is met when the computed return loss data are entirely below the threshold reference 240, such as shown for the simulated return loss data 244.

By enabling a manual modification of the test data 218, the testing system 200 is thus able to simulate return loss data obtained for a virtual test device in which the identified defective portions would have been modified. If the simulated return loss data satisfy the standard requirement of the compliance test, it means that all the defective portions have been identified and the correction operation then can actually take place in an efficient manner.

In conjunction with FIGS. 2A-2C, FIG. 3 is a flowchart of method steps performed in a TDR testing process according to one embodiment of the present invention. In initial step 302, an electronic device is tested in the TDR testing machine 204, which accordingly provide TDR test data 218 corresponding to sampled values of the reflection signal returned by the tested device during the TDR testing. In following step 304, the test data 218 are stored in the memory 208. In step 306, the testing application 216 then is launched to visually render the test data 218, and also compute the test data 218 to derive return loss data 242. In step 308, the return loss data 242 are then evaluated by the testing application 216 to determine whether a standard requirement is satisfied. As has been described above, the standard requirement may impose that the return loss data 242 be less than a threshold reference 240.

If the return loss data 242 do not satisfy the standard requirement, the tested device contains defective portions. To simulate a correction operation, the user in step 310 then can manually modify certain portions of the test data 218 that are identified as likely corresponding to the defective portions of the tested device. While the modification of the test data 218 has been described as being manually done, it is worth noting that the modification of the test data 218 may also be programmed to be automatically computed by the testing application 216. The steps 306 and 308 then are repeated to reprocess the modified test data 218.

When the return loss data satisfy the standard requirement, it is then determined in step 312 whether any portions of the test data 218 have been modified. In case no changes have been introduced by the user in the test data 218, the tested device has passed the compliance test. Otherwise, the defective portions of the tested device corresponding to the modified portions of the test data 218 may be corrected in step 314. The modified device then may be tested again through the steps 302-308.

As has been described above, the TDR testing system and method are thus able to allow a user to flexibly modify the test data of the reflection signal provided by the testing machine, so that the correction operations on identified defective locations in the tested device may be simulated when the test data are computed for evaluation. When the evaluation step fails, the actual correction operations thus may be performed on the tested device in a more efficient manner. In particular, a testing operator can determine which modifications are more cost competitive and efficient before the corrections are actually applied, which saves labor cost and time.

The above description illustrates various embodiments of the present invention along with examples of how aspects of the present invention may be implemented. The above examples, embodiments, instruction semantics, and drawings should not be deemed to be the only embodiments, and are presented to illustrate the flexibility and advantages of the present invention as defined by the following claims.

We claim:

1. A method for performing time domain reflectometry (TDR) testing on an electronic component, the method comprising:
    applying a TDR test on the electronic component to generate resulting test data;
    deriving return loss data from the resulting test data;
    evaluating the return loss data and determining that a standard requirement has not been satisfied; and
    simulating a correction operation by:
        identifying a first portion of the resulting test data that corresponds to a first defective portion of the electronic component,
        modifying the first portion of the resulting test data,
        deriving modified return loss data from the modified first portion of the resulting test data, and
        evaluating the modified return loss data and determining that the standard requirement has been satisfied,
    wherein the first defective portion of the electronic component can be corrected based on the modified first portion of the resulting test data.

2. The method of claim 1, wherein the first portion of the resulting test data corresponds to a peak, a dip, a resonance, or a level shift from a required value.

3. The method of claim 1, wherein modifying the first portion of the resulting test data includes changing the first portion to an expected test value for satisfying the standard requirement.

4. The method of claim 3, wherein changing the first portion to an expected test value is performed by a user or a software program.

5. The method of claim 1, wherein evaluating the modified return loss data and determining that the standard requirement has been satisfied comprises evaluating the modified return loss data against a threshold reference.

6. The method of claim 1, wherein the resulting test data correspond to sampled values of a reflection signal returned by the electronic component when the TDR test is applied.

7. The method of claim 1, further comprising correcting the first defective portion of the electronic component based on the modified first portion of the resulting test data.

8. A computer testing system, comprising:
    a memory for storing test data resulted from a time domain reflectometry test applied on an electronic component; and
    a processing unit configured to:
        derive return loss data from the resulting test data;
        evaluate the return loss data and determining that a standard requirement has not been satisfied; and
        simulate a correction operation by:
            identifying a first portion of the resulting test data that corresponds to a first defective portion of the electronic component,
            modifying the first portion of the resulting test data,
            deriving modified return loss data from the modified first portion of the resulting test data, and
            evaluating the modified return loss data and determining that the standard requirement has been satisfied,
        wherein the first defective portion of the electronic component can be corrected based on the modified first portion of the resulting test data.

9. The system of claim 8, wherein the first portion of the resulting test data corresponds to a peak, a dip, a resonance, or a level shift from a required value.

10. The system of claim 8, wherein the processing unit is configured to change the first portion of the resulting test data to an expected test value for satisfying the standard requirement.

11. The system of claim 8, wherein the processing unit is configured to change the first portion based on an input that is defined either by a user or in a software program.

12. The system of claim 8, wherein, to evaluate the modified return loss data and determine that the standard requirement has been satisfied, the processing unit is configured to evaluate the modified return loss data against a threshold reference.

13. The system of claim 8, wherein the resulting test data correspond to sampled values of a reflection signal returned by the electronic component when the time domain reflectometry test is applied.

14. A non-transitory computer-readable medium containing a sequence of instructions executable within a computer testing system including a processing unit and a physical memory for storing test data resulted from a time domain reflectometry test applied on an electronic component, wherein the sequence of instructions, when executed by the processing unit, causes the processing unit to:
    derive return loss data from the resulting test data;
    evaluate the return loss data and determining that a standard requirement has not been satisfied; and
    simulate a correction operation by:
        identifying a first portion of the resulting test data that corresponds to a first defective portion of the electronic component,
        modifying the first portion of the resulting test data,
        deriving modified return loss data from the modified first portion of the resulting test data, and
        evaluating the modified return loss data and determining that the standard requirement has been satisfied,
    wherein the first defective portion of the electronic component can be corrected based on the modified first portion of the resulting test data.

15. The non-transitory computer-readable medium of claim 14, further containing a sequence of instructions, which when executed by the processing unit in the computer testing system, causes the processing unit to change the first portion of the resulting test data to an expected test value for satisfying the standard requirement.

16. The non-transitory computer-readable medium of claim 14, further containing a sequence of instructions, which when executed by the processing unit in the computer testing system, causes the processing unit to evaluate the modified return loss data against a threshold reference.

* * * * *